United States Patent [19]

Washizaki et al.

[11] Patent Number: 5,356,501
[45] Date of Patent: Oct. 18, 1994

[54] FILM APPLYING METHOD AND FILM APPLYING APPARATUS

[75] Inventors: Yoji Washizaki; Hiroyoshi Nakano, both of Saitama, Japan

[73] Assignee: Somar Corporation, Tokyo, Japan

[21] Appl. No.: 961,368

[22] Filed: Oct. 15, 1992

[30] Foreign Application Priority Data

Dec. 13, 1991 [JP] Japan .................. 3-352370

[51] Int. Cl.$^5$ ............................................. B32B 31/10
[52] U.S. Cl. .................................... 156/256; 156/269; 156/521; 156/552
[58] Field of Search ............... 156/324, 269, 256, 517, 156/521, 522, 552, 555

[56] References Cited

U.S. PATENT DOCUMENTS

| | | | |
|---|---|---|---|
| 3,981,406 | 9/1976 | Eldridge | 414/793.2 |
| 4,322,069 | 3/1982 | Mitchell | 271/292 |
| 4,659,419 | 4/1987 | Miyake | 156/522 |
| 4,844,758 | 7/1989 | Hamamura | 156/522 |
| 4,885,048 | 12/1989 | Sumi | 156/555 |
| 4,887,706 | 12/1989 | Gladish | 198/775 |
| 4,964,937 | 10/1990 | Seki | 156/522 |
| 5,053,099 | 10/1991 | Seki | 156/522 |
| 5,110,391 | 5/1992 | Taguchi | 156/522 |
| 5,211,800 | 5/1993 | Taguchi | 156/521 |

FOREIGN PATENT DOCUMENTS

| | | |
|---|---|---|
| 0125584 | 11/1984 | European Pat. Off. . |
| 0426931A2 | 5/1991 | European Pat. Off. . |
| 0436065A2 | 7/1991 | European Pat. Off. . |
| 63-208037 | 8/1988 | Japan . |
| 37344 | 1/1991 | Japan . |

OTHER PUBLICATIONS

Japanese Patent Abstract JP 63208037–dated Aug. 29, 1988.
Japanese Patent Abstract JP 3007344–dated Mar. 18, 1991.
European Search Report 92117647.5 dated Feb. 10, 1993.

*Primary Examiner*—Michael Ball
*Assistant Examiner*—Daniel J. Stemmer
*Attorney, Agent, or Firm*—Sughrue, Mion, Zinn, Macpeak & Seas

[57] ABSTRACT

A film applying apparatus includes upper and lower mounting members for upper and lower suction plates, which are driven by a servomotor through pinions and racks to move the suction plates to positions located at a prescribed distance from a base plate. Thereafter, power is applied to the upper and lower mounting members by common pneumatic cylinders to move the upper and lower suction plates from their positions toward the base plate to tentatively apply films to the upper and lower sides of the base plate. The tentative applying forces of the upper and lower suction plates are equal to each other. After the tentative film application, the suction plates are quickly moved away from the base plate. A film applying method also is provided. With this structure and method, support members for first and second film feed members are dispensed with to reduce the operation time of the film applying apparatus and to simplify the structure thereof, and power from common drivers to the film feed members is applied to equalize the tentative applying forces to the suction plates.

4 Claims, 12 Drawing Sheets

FILM APPLYING METHOD AND FILM APPLYING APPARATUS

BACKGROUND OF THE INVENTION

This application is based on and claims priority from Japanese Application No. HEI 3-352370 filed Dec. 13, 1991, the disclosure of which is incorporated by reference herein.

The present invention relates to a film applying method and a film applying apparatus, and more particularly relates to a film applying method and a film applying apparatus, in each of which a base plate is conveyed, and first and second film feed members, opposed to the upper and lower sides of the base plate, which attract leading edges of films and which are then moved toward the leading edges of the upper and lower sides of the base plate conveyed to a film applying position, to tentatively apply the leading edges of the films to the leading edges of the base plate. Thereafter, the films are completely applied to the base plate under pressure by pressure applying rollers so that each of the films completely applied to the sides of the plate has a length corresponding to that of the plate.

Generally, a printed circuit board for an electronic machine such as a computer has wirings made of copper or the like in a prescribed pattern on one or both sides of an electrically insulating base plate. In manufacturing the printed circuit board, a stratified film consisting of a photosensitive resin layer, which is a photoresist layer, and a light-transmissible resin film, which is a protective film for protecting the layer, is first applied, under heat and pressure, to an electroconductive layer which is a thin copper film provided on the base plate. The heat and pressure applying operation is performed by mass production by a film applying apparatus. Thereafter, a wiring pattern film is overlaid on the stratified film. Then, the photosensitive resin layer is exposed to light through the wiring pattern film and the light-transmissible resin film for a prescribed time.

Thereafter, the light-transmissible resin film is peeled from the base plate by a peeling unit, and the photosensitive resin layer exposed to the light is developed to make an etching mask pattern. The unnecessary portions of the electroconductive layer are removed by etching, and the remaining portions of the photosensitive resin layer are removed. Thus, the printed circuit board having wirings in the prescribed pattern is manufactured. For such film applying apparatuses, various systems have been proposed including those disclosed in the Japan Patent Applications (OPI) Nos. 208037/88 and 7344/91 filed by the present applicant (the term "OPI" as used herein means an "unexecuted published application").

FIG. 12 is a side view of such a conventional film applying apparatus which illustrates the structure and operation thereof. Since the apparatus is nearly symmetrical upwardly and downwardly from a conveyance passage for an electrically insulating base plate, only the upper half of the apparatus is shown in FIG. 12.

In the apparatus, a three-layer stratified film 1 consisting of three layers which are a light-transmissible resin film, a photosensitive resin layer and a second light-transmissible resin film is continuously wound on a supply roller 2 in advance. The film 1 is unwound from the supply roller 2 so that a film separation roller 3 separates the film into the light-transmissible resin film 1A and a stratified film 1B consisting of the second light-transmissible resin film and the photosensitive resin layer exposed on one side thereof, which is to be applied to the base plate.

The separated stratified film 1B is supplied to the surface of a main vacuum suction plate 5 (which is a film feed member) along a tension roller 9. An auxiliary vacuum suction plate 13 and a cutter 14 are provided at the feed passage for the film 1B downstream of the suction plate 5 with regard to the film feed direction. A vacuum suction bar 15 and a pressure applying roller 16 are provided at the feed passage for the film 1B downstream of the cutter 14. The suction plate 5 tentatively applies the film 1B to an electroconductive layer on the base plate 6 while holding the film on the suction plate by vacuum suction.

The suction plate 5 is supported by a support member to be movable upwardly and downwardly. The support member 7 can be moved toward and away from the base plate 6 in directions B. The support member 7 is attached with a guide member 8 to the body frame 9 of the apparatus so that the support member can be moved in the directions B while sliding on the guide member. A pair of such support members 7 are provided above and below the base plate conveyance passage so that the support members are moved upwardly and downwardly in conjunction with each other through a rack-and-pinion mechanism by a first driver (not shown in FIG. 12). The mechanism includes racks 7A provided on the support members 7, and a pinion 7B engaged with the racks and supported by the body frame 9 of the apparatus.

The suction plate 5 is supported by the support member 7 so that the plate can be moved toward and away from the base plate 6 in directions C independently of the movement of the support member by a second driver 11, such as a pneumatic cylinder, through a rack-and-pinion mechanism provided on a support member 12. The mechanism includes a first rack 12A secured to the support member 7, a pinion 12B engaged with the rack to be moved upwardly and downwardly along the rack by the driver 11, and a second rack 12C engaged with the pinion to be moved upwardly and downwardly in parallel with the first rack. The suction plate 5 has a tentatively-applying downstream end portion 5A in which a heater 5B is provided.

To tentatively apply the film 1B to the base plate 6 by the suction plate 5, the end portion 5A is moved to the vicinity of the base plate or into contact therewith as the film remains wound on the end portion. At that time, the end portion 5A is heated by the heater 5B to tentatively apply the leading edge of the film 1B to the base plate 6 under heat and pressure.

The auxiliary vacuum suction plate 13 attracts the leading edge of the film 1B to hold the film at the edge on the end portion 5A of the suction plate 5 to tentatively apply the film to the base plate 6. Accordingly, the suction plate 13 is moved toward and away from the feed passage for the film 1B in directions D by a driver 13A such as a pneumatic cylinder, which is fastened to the support member 7.

The cutter 14 is opposed to the suction plate 13 across the feed passage for the film 1B to cut the film 1B to a length corresponding to that of the base plate 6.

A pair of pressure applying rollers 16 also are provided above and below the base plate conveyance passage. The upper and lower films 1B tentatively applied to the base plate 6 are pinched thereon under prescribed pressure by the rollers 16 and also are heated by the rollers so that the films are completely applied to the base plate.

To move the suction plate 5 of the conventional film applying apparatus, the support member 7 not only must be moved, but also the second driver 11 and the rack-and-pinion mechanism which are provided on the support member must be moved together with the support member. Thus, the load on the first driver for the support member 7 is so heavy that the main vacuum suction plate cannot be moved quickly. This hinders the rapid operation of the apparatus and restricts the processing capacity thereof. This is a problem.

Further, since not only the support member 7 and the first driver but also various other devices, such as the second driver and the rack-and-pinion mechanism, must be provided to move the suction plate 5, the structure of the apparatus is complicated. This also is a problem.

Additionally, the upper and lower suction plates 5 are usually moved by pneumatic cylinders independently of each other. Thus, when the cylinders are supplied with air having the same pressure, a downward force acts on each of the upper and lower suction plates 5 due to gravity so that it is difficult to operate the plates synchronously, and the tentative pressure applying force of the upper suction plate is made stronger than that of the lower one.

To prevent this problem, the air pressure for the upper and lower pneumatic cylinders is regulated to operate the upper and lower suction plates 5 synchronously. However, precisely regulating the pressure in such a manner is difficult. Alternatively, the problem can be prevented by stopping the lower suction plate in a prescribed position by a stopper or the like during the upward movement of the suction plate, and the air pressure in the cylinder for the suction plate is somewhat increased. However, the tentative pressure applying force of the lower suction plate rises to make it difficult to equalize the power of the upper and lower suction plates.

SUMMARY OF THE INVENTION

The present invention was designed to solve the above-mentioned problems of the conventional systems. Accordingly, it is an object of the invention to provide a film applying method and a film applying apparatus. In the method and the apparatus according to the invention, members to which the film feed members are secured to be movable together therewith have a simple structure to reduce weight, quicken operation and expand an applying capacity, and further operating the film feed members simultaneously and synchronously together is ensured for upper and lower sides of a base plate, and the tentative pressure applying forces of the feed members are equalized for both sides of the plate.

In the film applying method, the base plate is conveyed, the first and second film feed members provided to be opposed to the upper and lower sides of the base plate attract the leading edges of the films on the feed members, and are moved toward the leading edges of the upper and lower sides of the base plate conveyed to a film applying position, to tentatively apply the leading edges of the films to the upper and lower sides of the base plate at the leading edges. Thereafter, the films are completely applied to the base plate under pressure by pressure applying rollers so that each of the films completely applied to the sides has a length corresponding to that of the base plate.

The method includes: securing the first and second film feed members to first and second mounting members slidably supported by the body frame of the film applying apparatus; providing a motor to drive the mounting members by rack-and-pinion mechanisms providing; providing drive cylinders to simultaneously drive the mounting members; moving the feed members toward the base plate by the motor so that the feed members are positioned at a prescribed distance from the base plate; moving the feed members from the predetermined positions toward the base plate by the cylinders so that the films are tentatively applied to the upper and lower sides of the base plate, respectively; and retracting the feed members from the base plate by the cylinders after the tentative applying operation. This method solves the problems of the conventional systems described above.

The film applying apparatus according to the invention includes: a device for conveying the base plate; first and second film feed members which are movable toward the leading edges of the upper and lower sides of the base plate conveyed to the film applying position, so that leading edges of the films are tentatively applied to the sides of the base plate at the leading edges thereof, and pressure applying rollers for completely applying the films to the sides of the base plate under pressure after the tentative film application, so that each of the films completely applied to the base plate has a length corresponding to that of the base plate.

The apparatus is characterized by including: first and second mounting members which are slidably supported by the body frame of the apparatus and to which the first and second film feed members are secured so that the feed members can be movable toward and away from the base plate; drive cylinders for simultaneously applying motive power to the mounting members to simultaneously move the feed members; a mechanism including first and second racks attached to the mounting members, and pinions engaged with the racks, to move the mounting members simultaneously and synchronously together; and a motor for driving the pinions to move the feed members. This structure solves the problems of the conventional system described above.

The drive cylinders may be provided in a pair at both ends of the first and second film feed members extending along the width direction of the films. Rubber pieces may be provided on the film suction sides of the first and second film feed members to extend along the width direction of the films. Support rollers may be provided on film feed passages between cutters and the pressure applying rollers to be located on the same planes as the film feed passages on the film suction sides of the first and second film feed members.

In the film applying method provided according to the present invention, the first and the second film feed members are secured to the first and second mounting members slidably supported by the body frame of film applying apparatus, and the mounting members are driven by the motor by rack-and-pinion mechanisms to move the film feed members toward the base plate to position the feed members a prescribed distance from the base plate. Then, the mounting members are driven simultaneously by the drive cylinders to move the feed members from their positions toward the base plate to tentatively apply the films thereto. Since the mounting members are driven by the motor through the rack-andpinion mechanisms, the film feed members are precisely positioned.

If the film feed members were to be moved by a motor to tentatively apply the films to the base plate, the feed members might be accurately positioned, but the motor would be overloaded to have a shorter service life. Further, if the base plate was not in the prescribed position when performing the tentative applying operation by moving the film feed members by the second motor as mentioned above, it would be difficult to tentatively apply the films to the upper and lower sides of the base plate by mutually equal forces.

On the other hand, by using the drive cylinders for the tentative applying, the problem of motor overload is avoided. Further, since the cylinders are driven by the pressure of a fluid such as air, the films are tentatively applied to the upper and lower sides of the base plate by mutually equal forces even if the base plate is not in the prescribed position.

After the tentative applying operation is completed, the first and second film feed members are retracted from the base plate by the drive cylinders. Since relatively high motive forces can be applied to the film feed members by the cylinders, the feed members can be moved away from the base plate by the cylinders more quickly than by the second motor. This results in a faster tentative applying operation.

In the film applying apparatus according to the invention, the first and second film feed members are secured to the first and second mounting members slidably supported by the body frame of the apparatus, and the mounting members are simultaneously driven by the cylinders to simultaneously move the film feed members to tentatively apply the films to the upper and lower sides of the base plate.

Since the film feed members are thus moved for the tentative applying simply by driving the mounting members, it is unnecessary to provide either support members for moving the film feed members, or drivers for moving the film feed members on the support members, as in the conventional systems. Thus, the weight of the mounting members can be reduced to quicken the movement thereof and to expand the film application capacity of the apparatus, and the structure thereof can be made simpler.

Since the first and second mounting members provided for the upper and lower sides of the base plate are simultaneously driven by the cylinders and the racks are provided on the mounting members and are engaged with the pinions to move the mounting members simultaneously and synchronously by driving the pinions with the motor, the first and second film feed members can be moved simultaneously and synchronously either by the cylinders or by the motor.

Thus, the fluid pressure for each of the cylinders for the first and second film feed members need not be regulated, but the film pushing forces which tentatively apply the films to the upper and lower sides of the base plate can be made equal. The drive cylinders may be provided in a pair at both ends of the first and second film feed members extending along the width direction of the films. This prevents the motive force for each film feed member and the pushing force thereof from being made nonuniform along the film width.

Further, the rubber pieces may be provided on the film suction side of each film feed member to apply a high frictional force to the film and each rubber piece such that the feed member reliably attracts and holds the film thereon. The support rollers may be provided on the film feed passages between the cutters and the pressure applying rollers to be located on the same planes as the film feed passages on the film suction sides of the first and second film feed members. This will guide the films precisely to the pressure applying rollers without rubbing the surfaces of the film holding members or those of the cutters, after the cutoff of the films by the cutters, regardless of the outside diameters of the pressure applying rollers.

BRIEF DESCRIPTION OF THE DRAWINGS

The invention will be more clearly understood from the following description in conjunction with the accompanying drawings, wherein.

DETAILED DESCRIPTION OF THE PREFERRED EMBODIMENTS

One of the embodiments of the invention described hereafter is a film applying method in which stratified films 1B each having a length corresponding to that of an electrically insulating base plate 6 are applied to the sides of the plate by a film applying apparatus, which is another embodiment of the invention.

Figure 1:
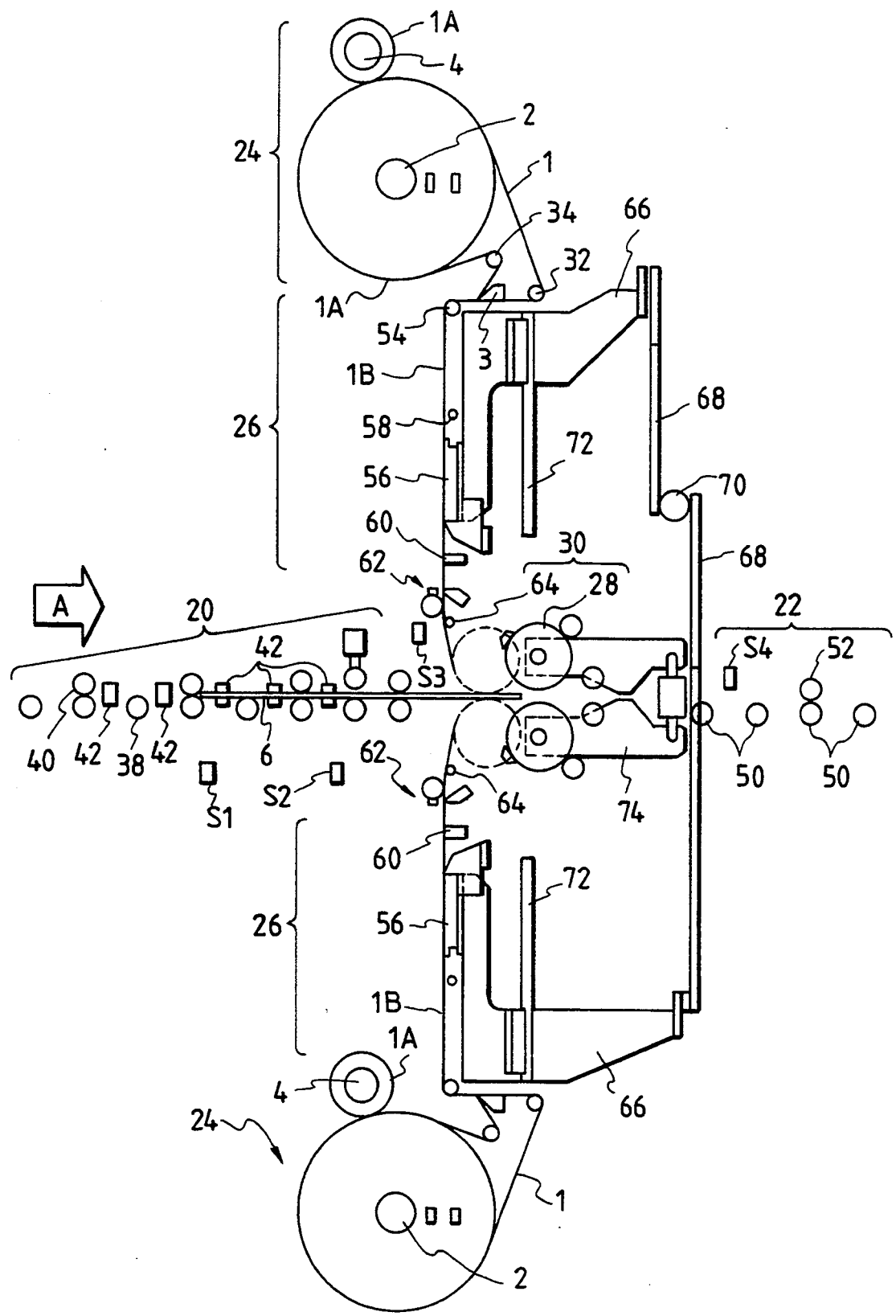
FIG. 1 is a schematic view of the film applying apparatus which is an embodiment of the present invention.
Figure 2:
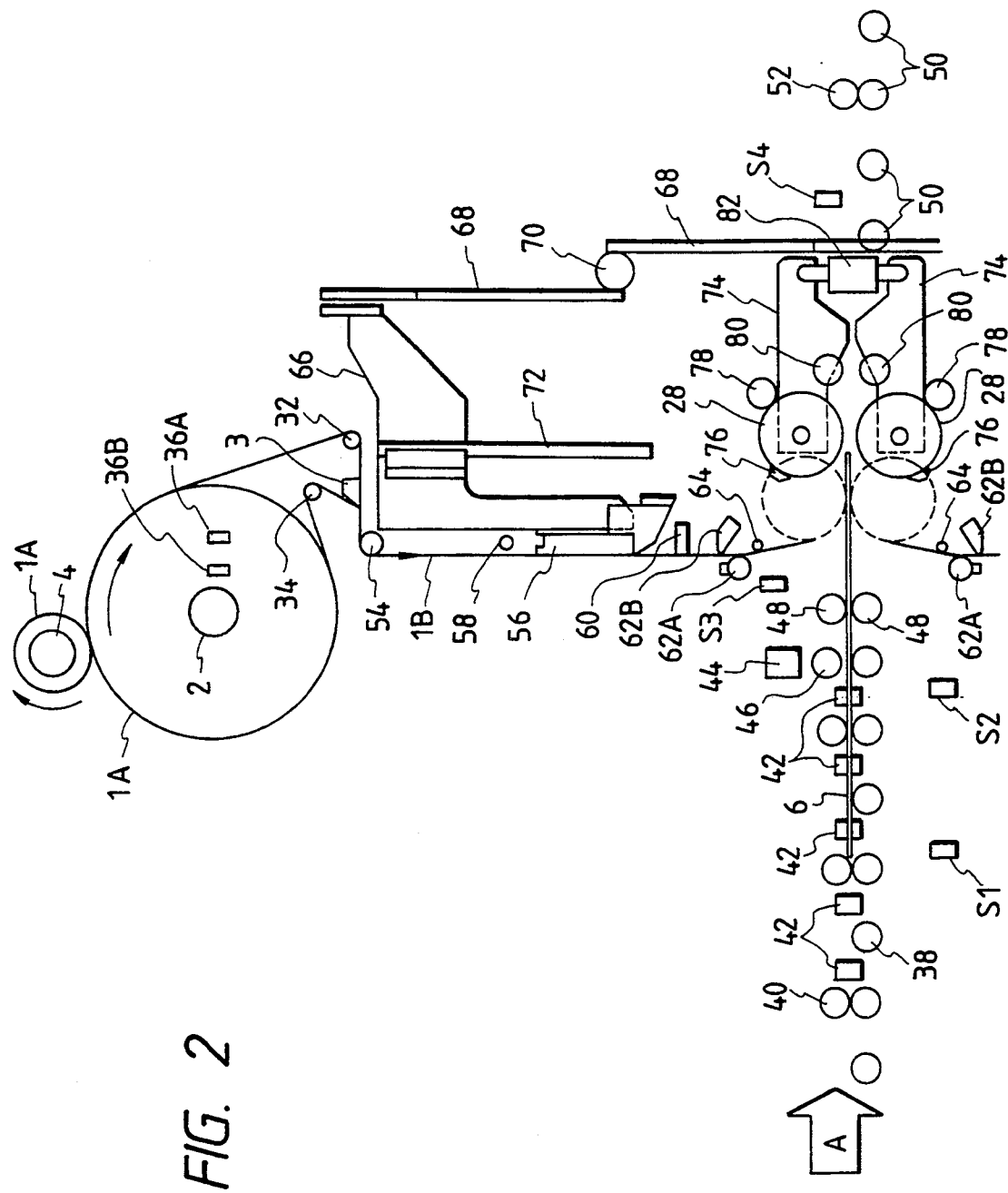
FIG. 2 is a side view of the upper half of the apparatus and the vicinity of a base plate conveyance passage.

As shown in FIGS. 1 and 2, the apparatus includes: a base plate convey-in section 20 for conveying the base plate 6 to a tentative applying position and a complete pressure applying position; a base plate convey-out section 22 for conveying the base plate with the films 1B completely applied thereto under heat and pressure from the application position; stratified film storage sections 24 which store three-layer stratified films 1, each consisting of a light-transmissible resin film, a photosensitive resin layer and a second light-transmissible resin film, and which feed the films 1B each consisting of the light-transmissible resin film and the photosensitive resin layer exposed on one side thereof, which is to be applied to the base plate 6; tentative applying sections 26 for tentatively applying the leading edges of the films 1B to the sides of the base plate; and a pressure applying section 30 which completely applies the two-layer stratified films 1B tentatively applied to the sides of the base plate, under heat and pressure by pressure applying rollers 28.

In each of the stratified film storage sections 24, the three-layer stratified film 1 is continuously wound on a supply roller 2 in advance so that the film is stored. The film 1 is unwound from the supply roller 2 to a film separation roller 3 along a guide roller 32 so that the roller 3 separates the film into the first light-transmissible film 1A as a protective film, and the two-layer stratified film 1B consisting of the second light-transmissible resin film and the photosensitive resin layer exposed on one side thereof, which is to be applied to the base plate 6. The separated film 1A is wound onto a winding roller 4 along a guide roller 34 and the three-layer stratified film 1. A large film winding diameter sensor 36A for detecting that the diameter of the wound film 1 on the supply roller 2 is larger than a prescribed value, and a small film winding diameter sensor 36B for detecting that the diameter is smaller than a prescribed value are positioned alongside the film wound on the roller.

In the base plate convey-in section 20, a plurality of drive rollers 38 are provided at appropriate intervals along a base plate convey-in passage to apply driving forces to the base plate 6 for conveyance thereof. Motive power is applied to the driver rollers 38 from a driver, such as a motor, to rotate the rollers. Idle rollers 40 are provided opposite every other driver roller 38 or as appropriate across the base plate conveyance passage so that the idle rollers and the drive rollers pinch the base plate 6 to reliably apply the driving forces thereto.

Sideward positioners 42 are provided appropriately between the drive rollers 38 along the base plate conveyance passage to sidewardly position the base plate 6. A base plate hold-down roller 46 is provided opposite the most downstream (with regard to the base plate conveyance direction) drive roller 38 across the conveyance passage near the upstream end of the pressure applying section 30, so that the hold-down roller can be moved upwardly and downwardly by a base plate hold-down device 44 formed of a pneumatic cylinder.

When the base plate hold-down roller 46 is moved down by the base plate hold-down device 44, the base plate 6 is pinched between the hold-down roller 46 and the corresponding drive roller 38 so that the base plate is prevented from vertically moving as the stratified films 1B are tentatively and completely applied thereto. Wet rollers 48 are provided downstream of the most downstream drive roller 38 to apply an air bubble generation preventive liquid, such as water, to the base plate 6 to prevent air bubbles from being generated between the base plate and each of the films 1B completely applied thereto.

Sensors S1, S2 and S3 for the base plate 6 are provided adjacent the base plate conveyance passage. The upstream sensor S1 is a sideward positioning start location sensor which detects the leading edge of the base plate 6 fed into the base plate convey-in section 20, and which outputs a detection signal to actuate sideward positioners 42. The intermediate sensor S2 is a base plate trailing edge sensor S2 provided downstream of the sensor S1 to detect the trailing edge of the base plate 6. The downstream sensor S3 is a base plate leading edge sensor provided near the upstream end of the pressure applying section 30 to detect the leading edge of the base plate 6.

In the base plate convey-out section 22, a plurality of drive rollers 50 are provided to be rotatable by a motor to apply driving forces to the base plate 6 for conveyance thereof. Idle rollers 52 are provided opposite appropriate drive rollers 50 across the base plate conveyance passage to pinch the base plate 6 between the idle rollers and the drive rollers to reliably apply the driving force to the base plate. A base plate passing sensor S4 is provided in the base plate convey-out section 22 near the downstream end of the pressure applying section 30 to detect passage of the base plate 6.

Each film 1B is fed from the storage section 24 to the tentative applying section 26 along a tension roller 54 which applies an appropriate tensile force to the film between the supply roller 2 and the suction plate 56 (which is a film feed member) to prevent the film from wrinkling or the like while being fed to the suction plate. A static electricity eliminator 58 is positioned at the feed passage between the tension roller 54 and the suction plate 56 to eliminate static electricity from the film 1B. A film holding member 60, a cutter 62 and a support roller 64 are provided at the film feed passage between the suction plate 56 and the pressure applying section 30.

The suction plate 56 attracts the leading edge of the film 1B to the plate as the film is fed from the supply roller 2, and then is moved toward the leading edge of the conveyed base plate 6 to tentatively apply the film to the leading edge of the base plate. The suction plate 56 is secured to mounting members 66 so that the plate and the members are movable together. The upper and lower suction plate 56 simultaneously attract the upper and lower films 1B to the plates, and are then simultaneously moved toward the base plate 6 to tentatively apply the films thereto. The suction plate 56 and the mounting members 66 are described in detail hereinafter.

The film holding member 60 attracts the leading edge of the film 1B on the film holding member by negative pressure, and then is moved back along the base plate conveyance direction A so that the film is attracted and wound on the end portion 56E of the suction plate 56. The film holding member 60 is described in detail hereafter.

The cutter 62 has a rotary cutting member 62A having a cutting edge, which spirally extends from the outer circumferential surface of the cylindrical member, and a fixed cutting member 62B having a straight cutting edge. The film 1B being fed across the fixed cutting member 62B is cut by the cutter 62 perpendicularly to the film feed direction as the rotary cutting member 62A is rotated to approach the fixed cutting member to cut the film to a prescribed length corresponding to that of the base plate 6.

To cut the film 1B by the cutter 62 perpendicularly to the film feed direction, one end of each of the rotary and fixed cutting members 62A and 62B are moved along the film feed direction during feeding so that the movement speed of the cutoff point by the cutter, in the feed direction, is equalized to the film feed speed.

The support roller 64 is provided on the feed passage for the film 1B between the cutter 62 and the pressure applying roller 28, and is located on the same plane as the film feed passage on the suction side of the main vacuum suction plate 56. The support roller 64 guides the film 1B to smoothly feed it to the pressure applying roller 28 after the film has been cut by the cutter 62 so that the film is not wrinkled or the like.

Figure 12:
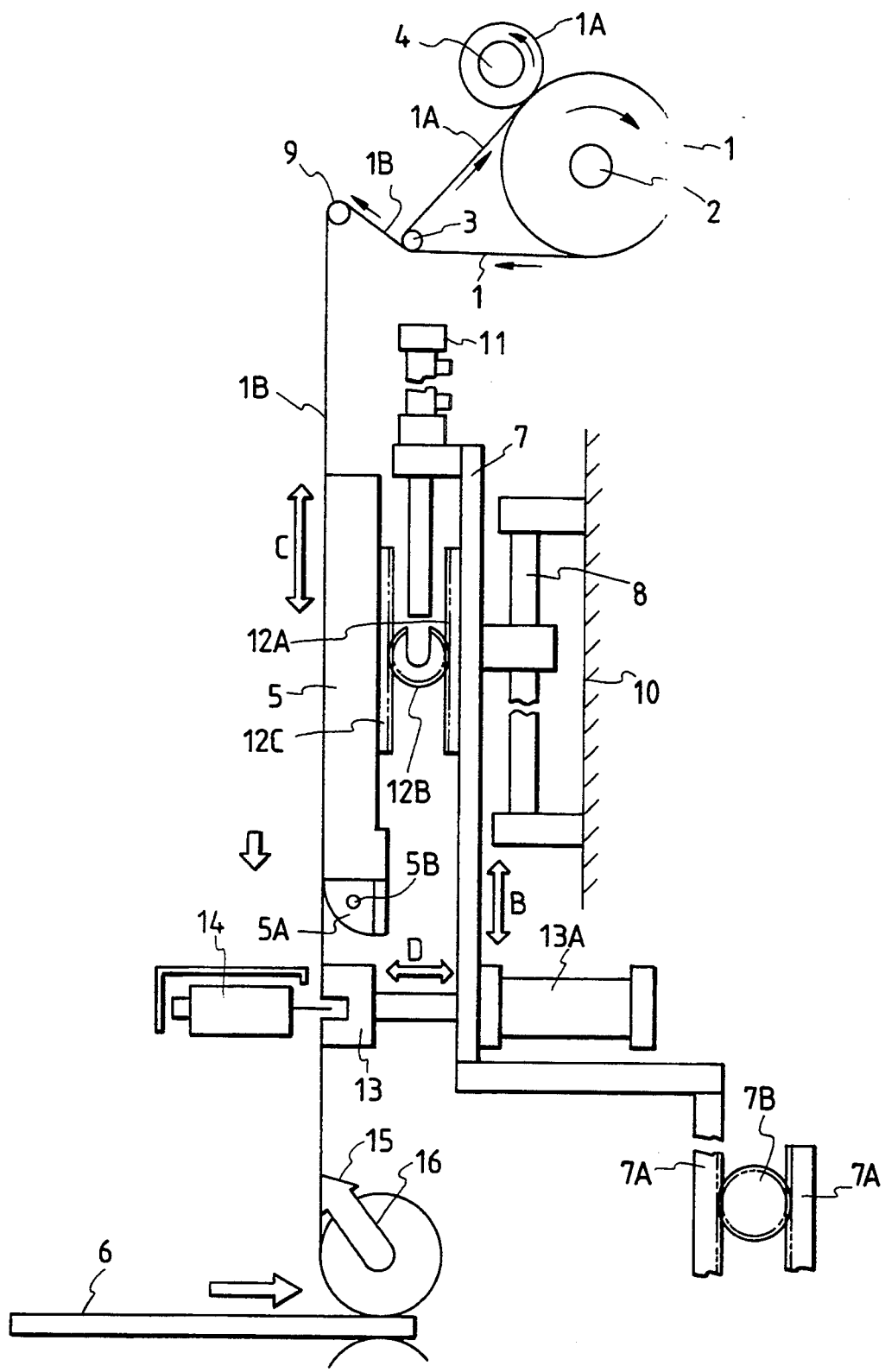
FIG. 12 is a side view of a conventional film applying apparatus.

The film holding member 60 is not attached to the mounting members 66 or the like, in contrast to a conventional member such as the auxiliary vacuum suction plate 13 shown in FIG. 12. Hence, there is a relatively large distance between the film holding member 60 and the suction plate 56 in their original positions so that the length of the film 1B extending from the suction plate to the cutter 62 is relatively large. As a result, the end portion 56E of the suction plate 56 is shaped to extend along the base plate conveyance direction to attract the film 1B thereon.

If the outer diameter of the pressure applying roller 28 is large, the tangent thereon is on the same plane as the film feed passage on the main vacuum suction plate 56 or is almost on the same plane, and no problem occurs. However, if the outer diameter is small, the tangent is at a relatively large distance from the film feed passage on the suction plate 56 so that the film 1B is likely to be fed toward the pressure applying roller 28 while being in contact with the fixed cutting member 62B of the cutter 62, to be wrinkled or the like. Therefore, the support roller 64 is provided to prevent the film 1B from contacting the fixed cutting member 62B.

The upper and lower mounting members 66, having the upper and lower suction plates 56 secured thereto, are provided similarly to each other, as shown in FIG. 1. Racks 68 are positioned on the mounting members 66 and engage pinions 70 to simultaneously and equally move the mounting members toward the base plate 6 together with the suction plates 56 while sliding on guide rails 72. The mounting members 66 are described in detail hereafter.

The pressure applying section 30 includes: the pressure applying rollers 28 for completely applying the film 1B to the upper and lower sides of the base plate 6 under heat and pressure; pressure applying roller support members 74 supporting the rollers 28 to move them backwardly and forwardly; vacuum suction bars 76 which are rotatable around the rollers while attracting the films on the bars; pressure applying roller wiping rollers 78 for wiping the air bubble generation preventive liquid off the pressure applying rollers; base plate wiping rollers 80 for wiping the liquid off the upper and lower sides of the base plate after the complete application of the films thereto, and two pneumatic cylinders 82 for swinging the upper and lower support members 74 symmetrically to vertically move the pressure applying rollers 28 to completely apply the films to the upper and lower sides of the base plate.

The tentative applying section 26 and the pressure applying section 30 are described in detail hereafter with reference to FIGS. 3-8.

Figure 3:
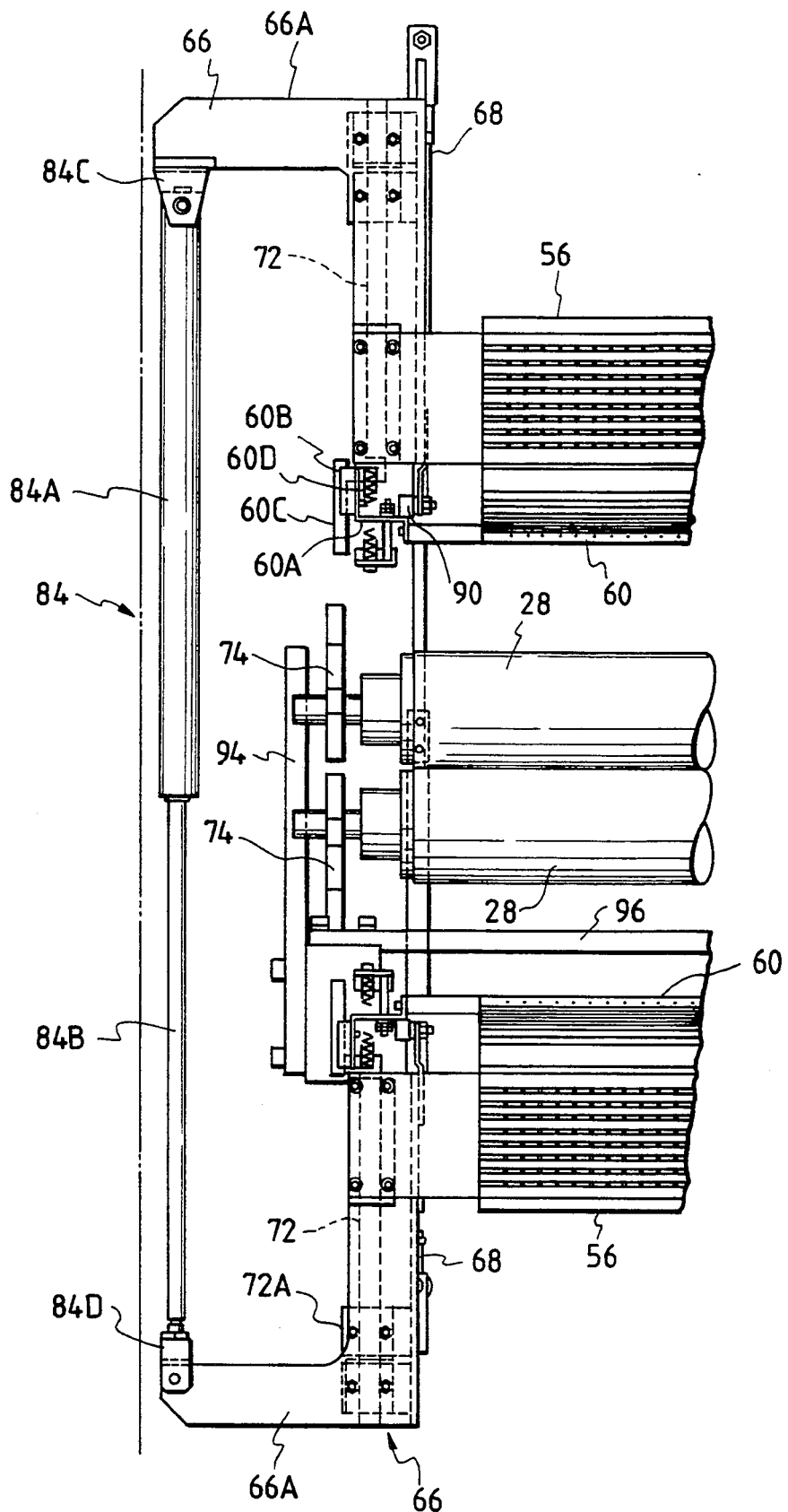
FIG. 3 is a front view of a right major part of the apparatus, as seen along the conveyance direction of a base plate.
Figure 4:
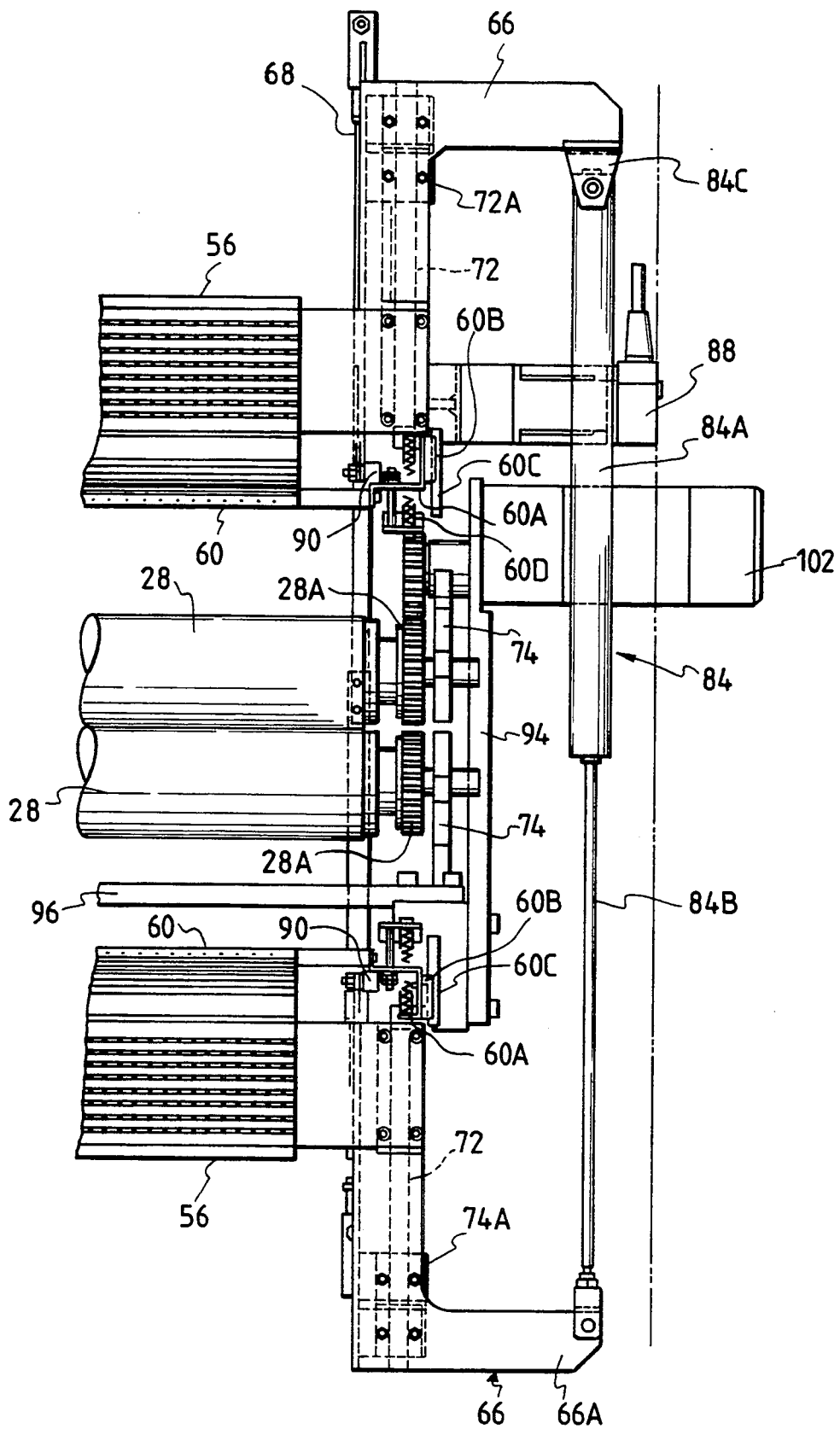
FIG. 4 is a front view of a left major part of the apparatus, as seen along the base plate conveyance direction.

As shown in. FIGS. 1, 3 and 4, the upper and lower suction plates 56 are provided symmetrically with regard to the base plate conveyance passage. The obverse side of each suction plate 56 has a number of grooves extending longitudinally of the plate (i.e., along the width direction of the film 1B), and has holes opened at appropriate intervals into the grooves and communicating with an air suction device (not shown in the drawings) such as an air pump so that the film having approached the plate is attracted thereon through the suction force of the device.

Each suction plate 56 includes the end portion 56E located at the downstream end of the suction plate 56 with regard to the feed direction of the film 1B and having an arc-shaped film suction side. The end portion 56E may be formed either separately from or integrally with the plate 56. A heater (not shown in the drawings) is provided in the portion 56A to heat it to tentatively apply the film at the leading edge thereof to the electroconductive layer on the base plate 6 under heat and pressure as the film is fed thereto by the suction plate 56.

Figure 9:
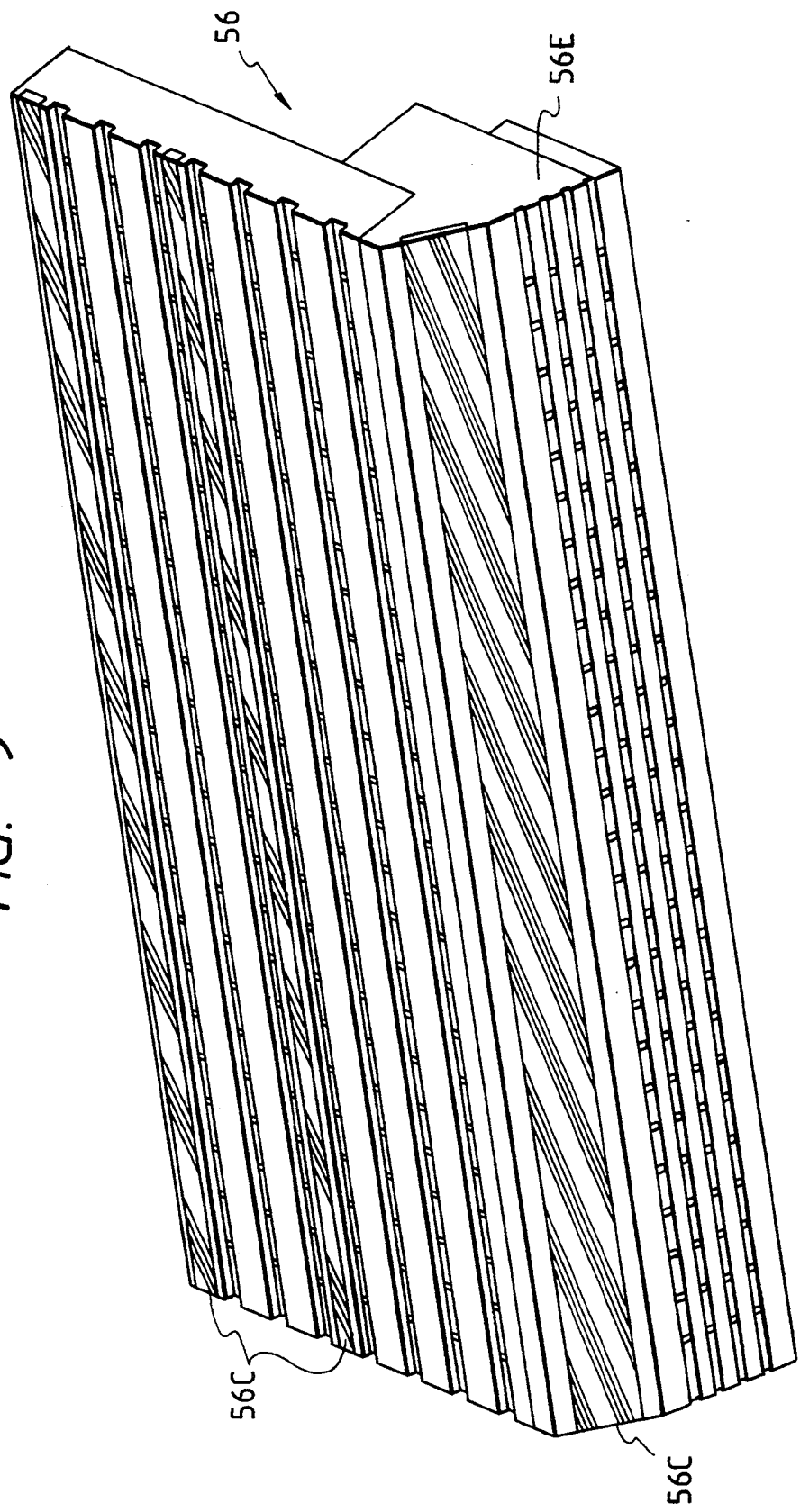
FIG. 9 is a perspective view of a modification of the main vacuum suction plate.

The obverse side of the suction plate 56 is made of a relatively smooth material. Rubber strips 56C made of natural rubber, synthetic rubber or the like may be secured to the obverse side of the suction plate 56 to extend longitudinally thereof or along the film width direction, as shown in FIG. 9, thereby increasing the coefficient of friction of the obverse side. If the rubber strips 56C are secured to the obverse side of the suction plate 56, the film 1B can be held reliably thereon by suction thereon and can be fed without deviation.

The suction plate 56 is secured at both its ends to the corresponding mounting members 66 by screws. The mounting members 66 are moved upwardly and downwardly on the guide rails 72 together with the suction plate 56. Each mounting member 66 includes a first arm 66A extending outwardly along the longitudinal direction of the suction plate 56, and a second arm 66B extending along the base plate conveyance direction, as shown in FIGS. 3-6. Pneumatic cylinders 84 are coupled to the tips of the first arms 66A of the upper and lower mounting members 66 to simultaneously and equally, e.g., synchronously, move the members together with the upper and lower suction plates 56.

Each pneumatic cylinder 84 includes a tubular body 84A, and a piston rod 84B which is movable into and out of the body 84A. The butts of the tubular bodies 84A of both pneumatic cylinders 84 are coupled to the tips of the first arms 66A of the upper mounting members 66 by hinge joints, while the tips of the piston rods 84B of the cylinders are coupled to those of the first arms 66A of the lower mounting members 66 by knuckle joints. The racks 68 are coupled with attaching members 68A to the second arms 66B of the upper and lower mounting members 66 at the tips of the arms, and are engaged with the pinions 70 to be simultaneously and equally moved upwardly and downwardly with the upper and lower suction plates 56. A simultaneous and equal movement shaft 86 extends from the right pinion 70 to the left pinion 70 to couple the pinions together to move the right and left racks 68 upwardly and downwardly simultaneously and equally.

Hence, the pinions 70 are secured to both ends of the shaft 86 to be rotatable together with the shaft. The shaft 96 is rotatably supported at both its ends with bearings (not shown in the drawings) and shaft support members 86A attached to the body frame 100 of the apparatus and fitted with pushing rollers 86B for pushing the racks from outside in the radial directions of the pinions to reliably engage the racks with the pinions.

Figure 5:
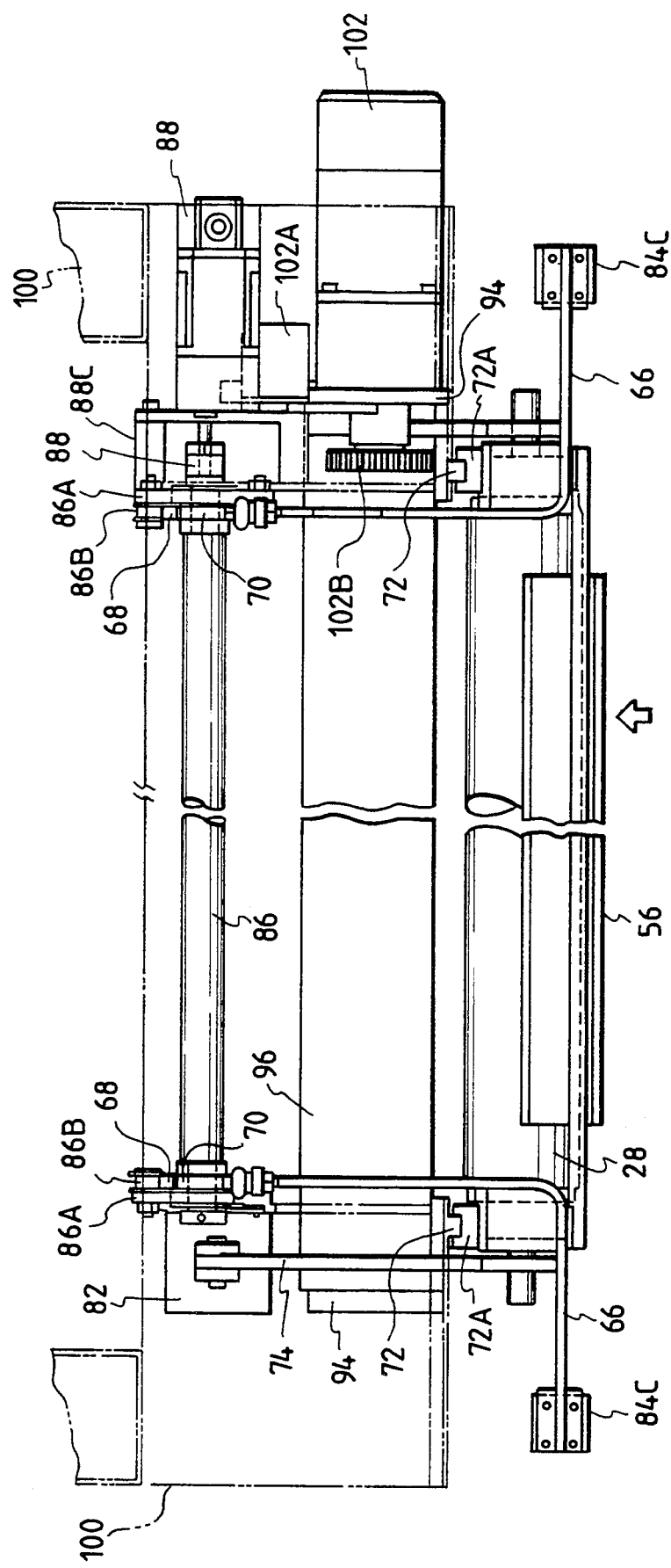
FIG. 5 is a plan view of the apparatus.
Figure 6:
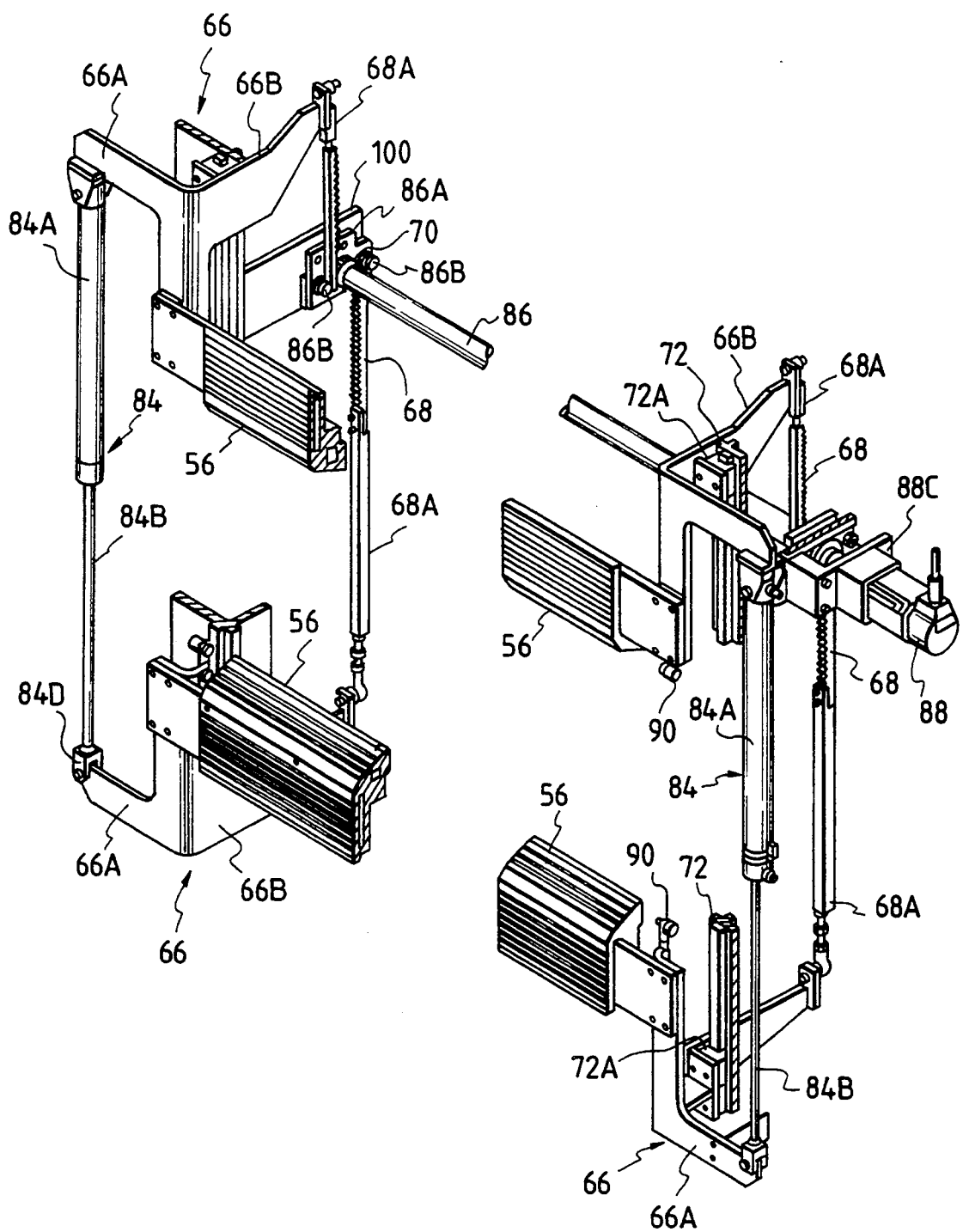
FIG. 6 is a perspective view of a major part of the apparatus, which includes main vacuum suction plates (film feed members), mounting members therefor, and a drive device for the film feed members.

As shown in FIGS. 4-6, a servomotor 88 is positioned on the axis of the shaft 86 to rotate the pinions 70 to move the mounting members 66 upwardly and downwardly together the suction plates 56 by the racks 68. The rotary shaft 88A of the servomotor 88 is coupled to the shaft 86 by a joint 88B so that the motive power of the servomotor is transmitted to the right and left pinions 70 through the joint 88B and the shaft 86. The servomotor 88 is coupled to the body frame 100 by a servomotor mounting member 88C. The mounting member 88C and one of the shaft support members 86A are coupled to the mutually opposite sides of the body frame 100. The servomotor 88 is provided with a clutch, such as an electromagnetic clutch, to transmit selectively the motive power of the servomotor to the rotary shaft 88A.

Cam followers 90 are attached with prescribed attaching members 90A to the tips of the portions of the mounting members 66 on which the suction plates 56 are mounted. When the suction plates 56 are moved to prescribed positions toward the base plate 6, the cam followers 90 come into contact with metal mounting members 60A for the film holding members 60 and move the members 60 toward the base plate. The film holding members 60 are attached with the mounting members 60A to sliders 60B, which slide upwardly and downwardly on guide rails 60C. Each mounting member 60A is fitted with a spring 60D for applying an urging force to the member 60A toward the suction plate 56.

When the cam followers 90 have come into contact with and have pushed the metal mounting members 60A, the springs 60D are compressed so that the film holding members 60 are moved toward the base plate 6 in concert with the movement of the suction plates 56 toward the base plate, until the film holding members reach prescribed positions to wind leading edges of the films 1B on the end portions 56E of the suction plates.

Figure 7:
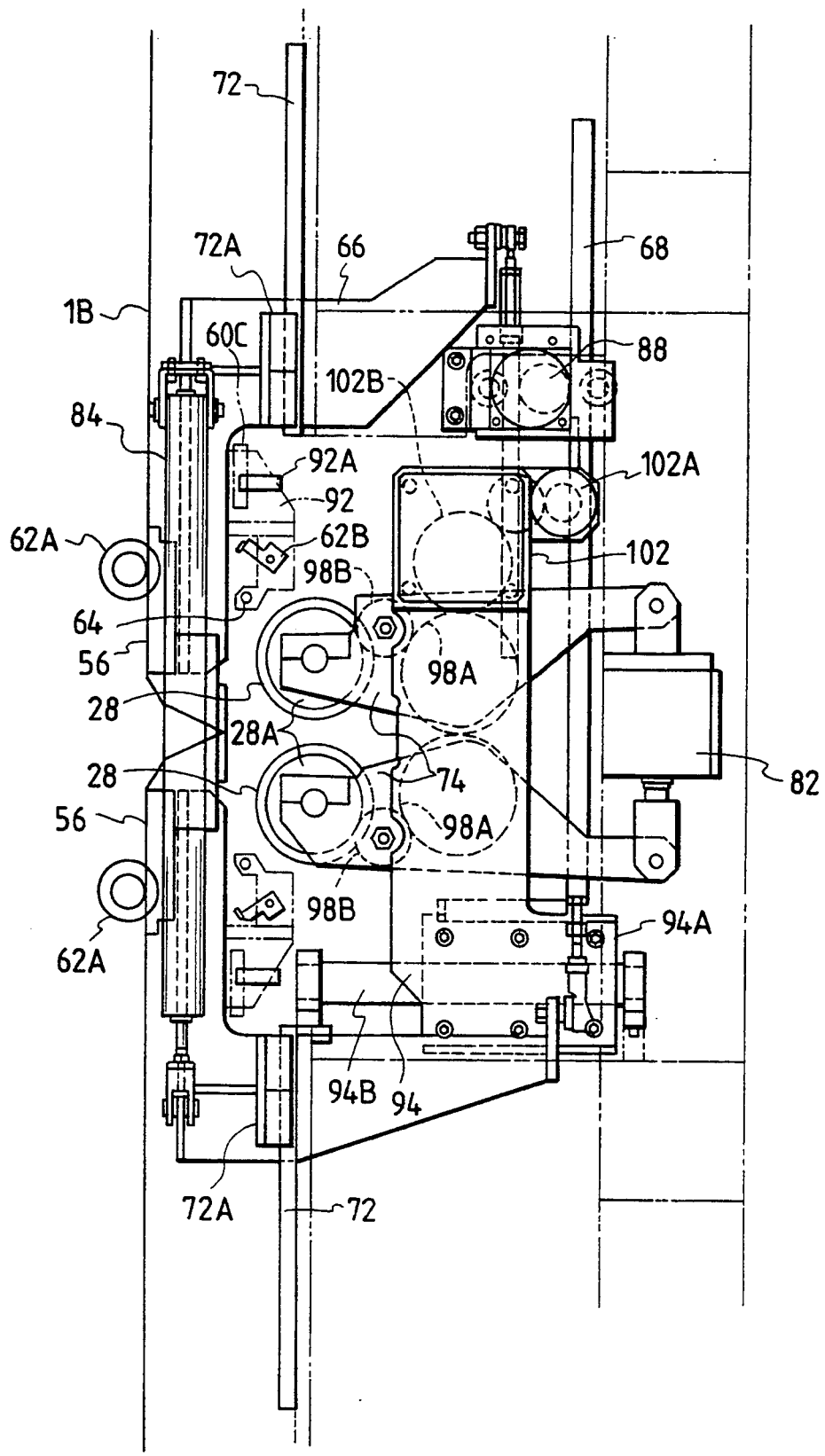
FIG. 7 is a side view of the apparatus to illustrate the films being tentatively applied to the base plate by the suction plates.

The mounting members 60A are moved upwardly and downwardly as the sliders 60B slide upwardly and downwardly on the guide rails 60C secured to moving members 92 which are moved back and forth on guide rails 92A extending along the baseplate conveyance direction, as shown in FIG. 7. The moving members 92 support the fixed cutting members 62B of the cutters 62 and the support rollers 64 at the ends of the widths of the films 1B. Pneumatic cylinders (not shown in the drawings) are provided to move the moving members 92 back and forth on the guide rails 92A along the base plate conveyance direction to move the fixed cutting members 62B and the support rollers 64 back and forth along the base plate conveyance direction together with the film holding members 60.

After the suction plates 56 are moved to prescribed positions toward the base plate 6 together with the film holding members 60 as the films 1B are held on the suction plates and the holding members, the holding members are moved along the base plate conveyance direction to wind the lead edges of the films on the end portions 56E of the suction plates. When the winding operation is completed, the moving members 92 are stopped and the suction plates 56 are then moved further toward the base plate 6 to tentatively apply the leading edges of the films 1B to the base plate. FIG. 7 shows the state in which the end portions 56E of the upper and lower suction plates 56 are moved toward the base plate 6, and the moving members 92 are stopped so as not to hinder the movement of the plates 56.

Figure 8:
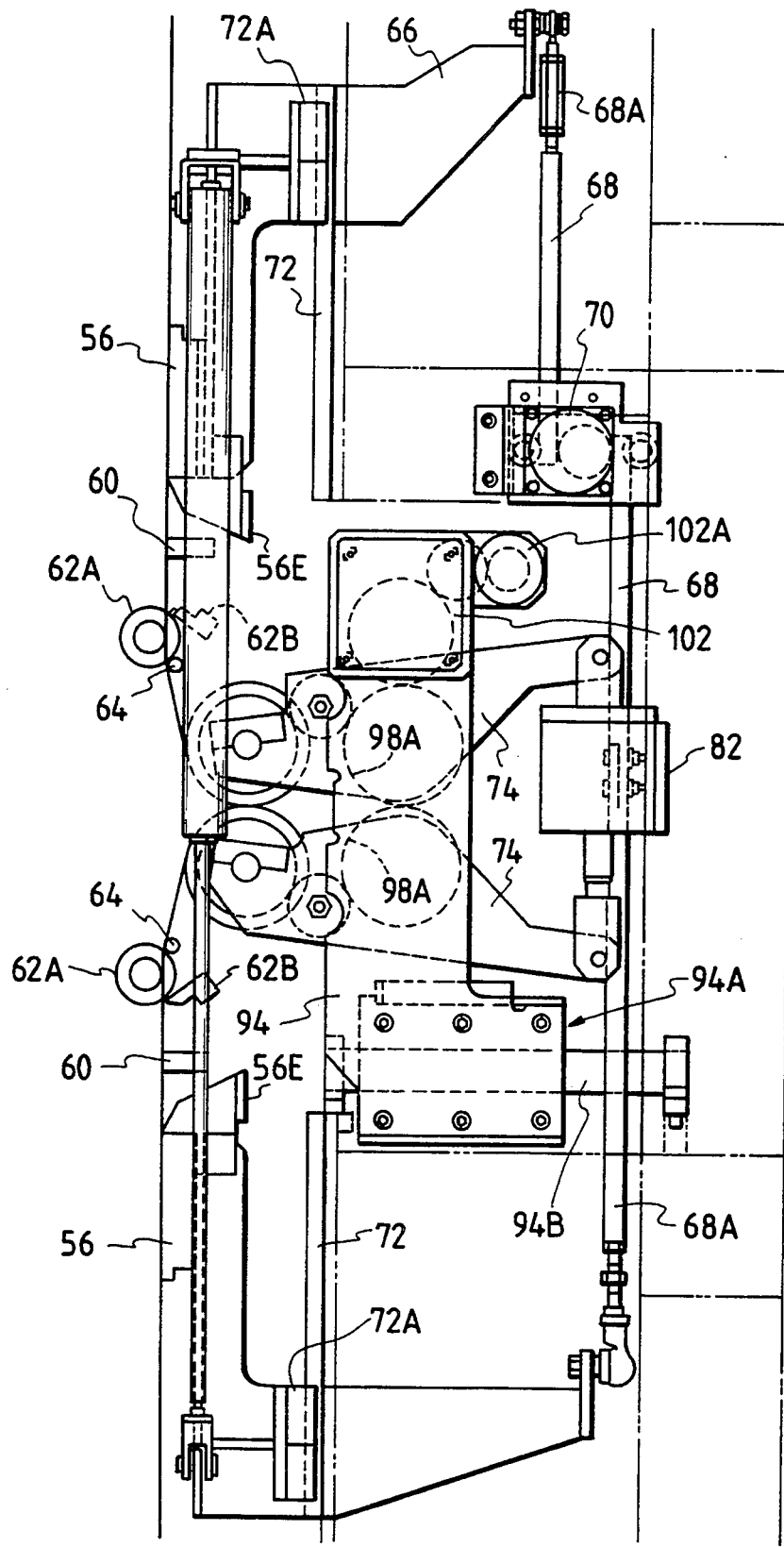
FIG. 8 is a side view of the apparatus to illustrate the films being completely applied to the base plate by pressure applying rollers.

FIG. 8 shows the films 1B completely applied to the upper and lower sides of the base plate 6 by the pressure applying rollers 28. Before the complete film application, the moving members 92 are moved back so that the film holding members 60, the fixed cutting members 62B of the cutters 62 and the support rollers 64 are returned to their original positions on the film feed passages. At the time of the tentative applying of the films 1B, each pressure applying roller 28 is put aside, as shown by the full lines in FIGS. 1, 2 and 7.

At the time of the complete application of the films 1B, each pressure applying roller 28 is placed near the tentative applying position, as shown by the dotted lines in FIGS. 1 and 2, and 8, to perform the complete film application. The shafts of the upper and lower rollers 28 extend along the width direction of the films 1B, and are rotatably supported at both ends of the shafts by the support members 74 supported in a swingable manner by right and left pressure applying roller bearers 94 commonly provided for the right and left ends of the rollers, respectively, as shown in FIGS. 3 and 4. The bearers 94 are located at both ends of the rollers 28 or at both the side edges of the films 1B, extend downwardly from the ends of the rollers, and are secured together by a bearer coupling member 96 at the lower portions of the bearers.

Sliders 94A are provided on the bearers 94 under the bearer coupling member 96 so that the sliders 94A are slidable back and forth on slide rails 94B extending along the base plate conveyance direction. Since the right and left bearers 94 are secured together by the coupling member 96, the bearers 94 can be moved back and forth along the base plate conveyance direction without positionally deviating from one another. As a result, the axes of the pressure applying rollers 28 can be maintained at a prescribed angle (e.g., 90 degrees in the embodiments) to the base plate conveyance direction while the rollers are moved back and forth along the conveyance direction.

First gears 98A are rotatably mounted on rotary shafts on the support members 74 to transmit motive power to the pressure applying rollers 28. A motor 102 for rotating the rollers 28 is provided on the upper portion of the right bearer 94. A gear 102B is provided on the rotary shaft of the motor 102, and is engaged with the upper first gear 98A. Roller gears 28A are provided on the shafts of the rollers 28 at one end thereof to be rotated together with the rollers. Second gears 98B are supported by the support members 74, and are engaged with the roller gears 28A and the first gears 98A to transmit the motive power of the motor 102 to the rollers 28 through the gears 102B, the first gears, the second gears and the roller gears.

Although the motor 102 and the gears 102B, 98A, 98B and 28A are provided only at the left side of the apparatus, such components may be provided at both the right and left sides thereof. Since the first gears 98A supported by the upper and lower roller support members 74 are engaged with each other, the upper and lower rollers 28 are rotated by the single motor 102. A rotary encoder 102A is provided on the motor 102 to detect the rotation speed of the rollers 28 through the rotational frequency of the motor. The pneumatic cylinders 82 are coupled to the support members 74 at the rear ends thereof to move the upper and lower rollers 28 together to completely apply the films 1B to the upper and lower sides of the base plate 6 under prescribed pressure, and to thereafter move the rollers away from each other. The two pneumatic cylinders 82 are provided for the right and left pairs of the upper and lower support members 74, respectively.

The vacuum suction bars 76 are rotatable concentrically to the rollers 28 in concert with the rotation thereof as the trailing edges of the films 1B remain attracted on the bars, and the rollers are rotated to completely apply the films to the upper and lower sides of the base plate 6. Thus, the films 1B are prevented from wrinkling or the like while being completely applied to the base plate 6. The wiping rollers 78 for wiping the rollers 28 are positioned appropriately away from the pressure applying points of the rollers 28 so that the air bubble generation preventive liquid clinging to the rollers is removed by wiping rollers 78 before the films 1B are completely applied to the base plate 6.

The wiping rollers 78 are rotatably supported by the support members 74 to be rotated by the rollers 28 as the rollers 78 are in contact with the rollers 28 under pressure due to the weight of the wiping rollers 78 or the urging force of springs. The base plate wiping rollers 80 are rotatably supported by the support members 74 downstream of the rollers 28 with regard to the base plate conveyance direction so that the air bubble generation preventive liquid clinging to the base plate is removed therefrom by the rollers 78.

The cutter 62 including the rotary and fixed cutting members 62A and 62B is capable of cutting the film 1B perpendicularly to the film feed direction regardless of the film being stopped or being fed. To cut the film 1B perpendicularly to the film feed direction as the film is stopped, the axes of the rotary and fixed cutting members 62A and 62B of the cutter 62 are kept horizontal. To cut the film 1B perpendicularly to the film feed direction as the film is being fed, the cutoff starting portions of the rotary and fixed cutting members 62A and 62B are displaced reversely to the film feed direction so that the axes of the cutting members are inclined to move the cutoff point of the cutter obliquely to the film feed direction.

Thus, the cutter 62 is inclined at an appropriate angle such that the movement speed of the cutoff point of the cutter, in the film feed direction, is equal to the film feed speed. The cutter 62 can be inclined by a pneumatic cylinder. Since the cutoff point is moved obliquely to the film feed direction so that the movement speed vector of the cutoff point has a component in the film feed direction as well as a component in the film width direction, the cutoff point is not moved relative to the film in the film feed direction while the film is being cut. Thus, the cutter 62 can cut the film 1B perpendicularly to the film feed direction.

Although the servomotor 88 and the pair of pneumatic cylinders 84 move the suction plates 56 toward and away from the base plate 6, the servomotor and the pair of pneumatic cylinders share the mutually different portions of the movement of plates 56. More specifically, the servomotor 88 moves the suction plates 56 to prescribed positions located at a prescribed distance from the surface of the base plate 6, and the pair of pneumatic cylinders 84 thereafter move the end portions 56E of the suction plates 56 towards the base plate to tentatively apply the films 1B to the base plate, and then to quickly move the suction plates 56 away from the base plate.

After the servomotor 88 moves the suction plates 56 to the prescribed positions toward the base plate 6 at a relatively high acceleration, the clutch for the motor is disengaged, and the pneumatic cylinders 84 move the suction plates 56 further toward the base plate to tentatively apply the film 1B to the base plate. Thus, the downward and upward forces which tentatively apply the films 1B to the upper and lower sides of the base plate 6 are equalized so that performing operations such as modulating the downward and upward forces for the upper and lower suction plates, as in the conventional systems, are unnecessary.

Further, even if the base plate 6 is slightly out of a prescribed position for having the films 1B tentatively applied thereto by moving the suction plates 56 toward the position, the downward and upward forces which tentatively apply the films can be equalized. Additionally, although a servomotor can move the suction plates 56 accurately to the prescribed positions toward the base plate to tentatively apply the films, the downward and upward tentative applying forces differ from each other if the base plate is even slightly out of the prescribed position. Shifting the base plate 6 into the prescribed position to prevent the downward and upward applying forces from differing from each other is very difficult. On the other hand, since the pneumatic cylinders 84 are driven by air pressure, downward and upward applying forces equal to each other can be applied reliably to the films 1B on the sides of the base plate 6 during the tentative application of the films thereto even if the base plate is slightly out of the prescribed position.

Furthermore, since the clutch for the servomotor 88 is disengaged and then the suction plates 56 are quickly moved away from the base plate 6 by the high motive power of the pneumatic cylinders 84, the time from the end of the tentative film application to the beginning of the complete application thereof is reduced, thereby allowing the complete application operation to begin quickly.

Figure 10:
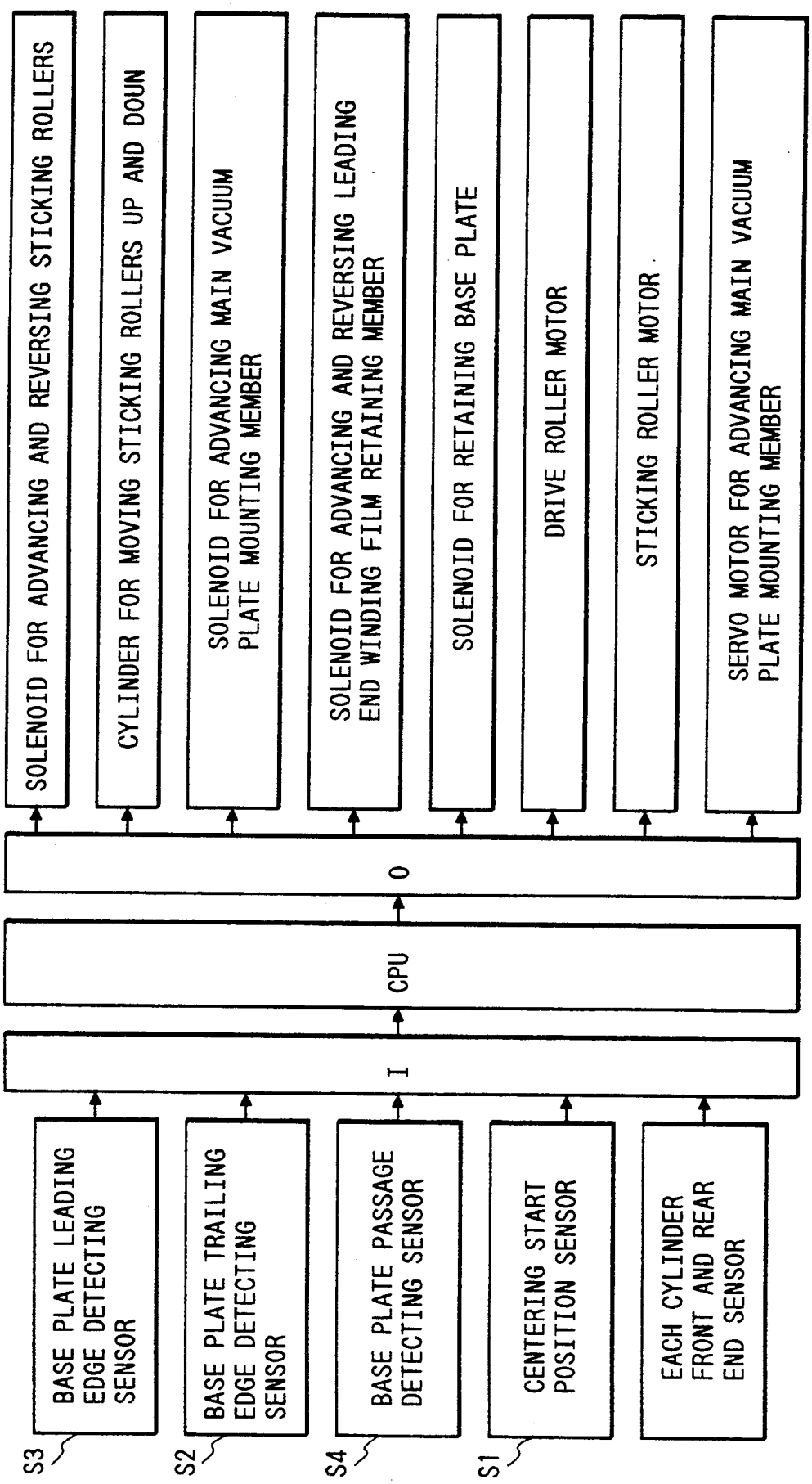
FIG. 10 is a block diagram of the control system of the apparatus to illustrate the output and input of electric signals.
Figure 11:
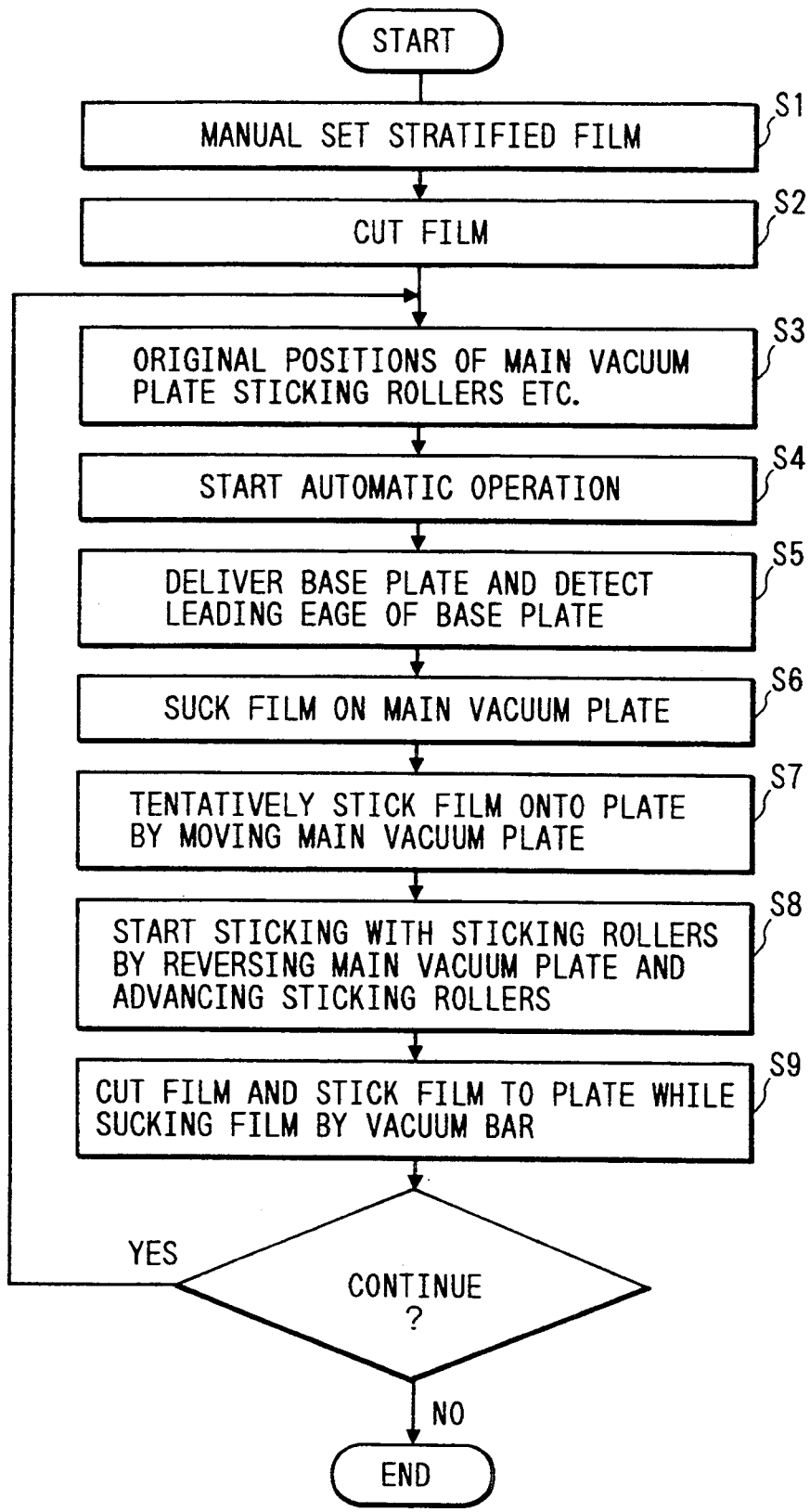
FIG. 11 is a flow chart of a procedure of the pressure application of the films to illustrate the operation of the apparatus.

FIG. 10 is a block diagram to illustrate the signal lines of the control system of the film applying apparatus. In the control system, a central control unit 110 outputs control signals to solenoids of the pneumatic cylinders and the motors in response to detection signals received from the sensors S1, S2, S3, S4, S36A and S36B, and other sensors, not shown in the drawings, but which are for detecting the front and rear ends of the piston rods of the cylinders. The central control unit 110 has counter and timer functions as well, and regulates the apparatus in a procedure shown in FIG. 11. For example, the control unit 110 is formed of a programmable controller or a relay sequence control circuit.

The operation of the film applying apparatus is described in detail hereunder. The apparatus is operated in the procedure shown in FIG. 6. Since the upper and lower halves of the apparatus are operated symmetrically, only the operation of the upper half is described hereafter.

The apparatus is manually set in a film applying operation preparation state in step 1. At that time, the supply roller 2 with the three-layer stratified film 1 sufficiently wound thereon is set in the apparatus, the film is unwound from the roller along the guide roller 32 and is separated into the light-transmissible resin film 1A and the two-layer stratified film 1B by the film separation roller 3. The film 1B is conveyed along the suction plate 56 and the cutter 62 while passing through a gap defined between the rotary and fixed cutting members 62A and 62B of the cutter and formed by manually separating the rotary cutting member from the fixed cutting member.

Thereafter, the film 1B is cut by the cutter 62 in step 2. At that time, the rotary cutting member 62A is manually rotated as the rotary and fixed cutting members 62A and 62B are not inclined. The suction plate 56, the pressure applying roller 28 and so forth are put in their original positions in step 3. At that time, the upstream end of the suction plate 56 is located slightly below its highest ascent position, the mounting members 60A for the film holding member 60 are pushed by the cam followers 90, and the film feed surfaces of the suction plate and the member 60 are positioned on the same plane.

Thereafter, the apparatus is placed into automatic operation in step 4. As a result, the film holding member 60 attracts the film 1B thereon and is moved along the base plate conveyance direction so that the leading edge of the film is attracted to and wound on the end portion 56E of the suction plate 56. The fixed cutting member 62B and the support roller 64 attached to the moving member 92 are moved backwardly because of the movement of the film holding members 60 caused by the movement of the moving member 92. The base plate 6 is introduced into the base plate convey-in section 20 so that after the base plate is detected by the sideward positioning start location sensor S1, the base plate is positioned into a prescribed sideward position by the sideward positioners 42. When the leading edge of the base plate 6 positioned sidewardly and being conveyed in the conveyance passage is detected by the base plate leading edge sensor S3, a detection signal is output from the sensor to cause the first counter of the central control unit 110 to start counting for a prescribed time.

When the counting operation has been performed for the prescribed time, the leading edge of the base plate 6 is stopped in the tentative applying position. The detection also causes the second counter of the control unit 110 to starting counting. When the counting operation by the second counter has been performed for a prescribed time, the film holding member 60 is moved back along the base plate conveyance direction so that the film 1B is attracted to and wound on the end portion 56E of the suction plate 56.

By the time that the suction plate 56 is moved downwardly to tentatively apply the film 1B to the base plate 6, the base plate hold-down device 44 is driven to move down the base plate hold-down roller 46 to pinch the base plate between the roller 46 and the drive roller 38. Then, the main vacuum suction plate 56 is moved down to tentatively apply the leading edge of the film 1B to the base plate 6 in step 7.

During the counting operation by the second counter, the servomotor 88 is driven to move the upper and lower suction plates 56 simultaneously and synchronously toward the upper and lower sides of the base plate 6 by the pinions 70 and the racks 68. The driving of the servomotor 88 is stopped when each of the downstream ends of the suction plates 56 is moved to the prescribed position located at 2 cm, for example, from the base plate 6.

Thereafter, the pair of pneumatic cylinders 84 are driven to move the plates 56 so that the end portions 56E thereof approach the upper and lower sides of the base plate 6 to tentatively apply the films 1B under the pushing power of the cylinders. Since the pair of pneumatic cylinders 84 are provided at both ends of the suction plates 56 extending along the width directions of the films 1B, as shown in FIGS. 3 and 4, the films are tentatively applied to the upper and lower sides of the base plate 6 by mutually equal forces. When the suction plates 56 move to tentatively apply the films 1B, the clutch is disengaged to keep the motive power of the servomotor 88 from being transmitted to the pinions 70.

Thereafter, the suction plate 56 is moved away from the base plate 6, and the pressure applying roller 28 is moved toward the base plate without interfering with the end portion 56E of the suction plate 56. The roller 28 starts completely applying the films 1B to the base plate under heat and pressure, in step 8. The positions of the rollers 28 completely applying the films 1B to the base plate (not illustrated) under heat and pressure are shown in FIG. 8.

When the portion of the film 1B, which is to become the leading edge of the film when the portion is cut by the cutter 62, arrives at the cutter by the progress of the application of the film to the base plate 6, the film is attracted to the suction plate 56 and cut by the cutter, in step 9. At the beginning of the cutting operation, the cutter 62 is inclined so that the movement speed of the cutoff point, in the film feed direction, is equalized to the film feed speed to cut the film perpendicularly to the film feed direction. During and after the cutting operation, the film 1B is guided by the support roller 64 so that even if the diameter of the pressure applying roller 28 is small, the film is fed without sliding on the fixed cutting member 62B of the cutter 62.

During the complete application of the film 1B to the base plate 6 and after the cutting operation, the vacuum suction bar 76 starts attracting the film on the bar so that the film slides on the outer surface of the bar while being completely applied to the base plate 6. When the leading edge of the film 1B is near the suction bar 76, the bar is rotated around the pressure applying roller 28 toward the base plate 6 so that the bar keeps attracting the film thereon until immediately before the application of the film to the base plate is completed. Thus, an appropriate tensile force is applied to the film 1B to prevent it from wrinkling or the like. After the film 1B is cut by the cutter 62, the suction plate 56 and the film holding member 60 attract the trailing portion of the film so that the trailing portion is held on the suction plate 56 and the member 60.

Thereafter, it is determined whether the film applying operation of the apparatus should be continued. If it is determined that the film applying operation should be continued, steps 5–9 are performed again. If the operation is not to be continued, the operation is terminated.

According to the present invention, first and second mounting members are not fitted with support members and drive cylinders or the like for driving film feed members separately from the support members. Thus, the film applying apparatus is smaller and has a reduced weight to facilitate positioning, and thus a quick applying operation may be performed. Further, the applying capacity of the apparatus is expanded, and the structure of the apparatus is made simpler.

Further, since drive cylinders are provided to simultaneously apply motive power to the first and second mounting members to precisely equalize the tentative application forces of the first and second film feed members, modulating the applying forces separately from each other is unnecessary, and the operation of the apparatus is made easier and has increased efficiency.

The present invention is not confined to the above-described embodiments, but may be embodied or practiced in other various ways without departing from the spirit, scope, or essential character of the invention, as defined in the appended claims.

What is claimed is:

1. A film applying method comprising the steps of:
   conveying a base plate having first and second sides to a film applying position;
   attracting leading edges of films onto first and second film feed members opposed to said first and second sides of said base plate, said first and second film feed members being secured to first and second mounting members slidably supported by a body frame of a film applying apparatus;

moving said first and second film feed members toward leading edges of the first and second sides of said base plate, such that the leading edges of said films are tentatively applied to the leading edges of said first and second sides of said base plate, respectively, by driving said first and second mounting members with only a motor through rack-and-pinion mechanisms from respective original positions toward said base plate such that said first and second feed members are positioned in predetermined positions at a prescribed distance from said base plate, said predetermined positions being close to said base plate as compared to the original positions, and then simultaneously driving said first and second mounting members via only drive cylinders from said predetermined positions toward said base plate such that said films are tentatively applied to said first and second sides of said base plate, respectively;

driving said first and second mounting members away from said base plate utilizing only said drive cylinders after said films are tentatively applied to said base plate; and completely applying said films to said first and second sides of said base plate by pressure applying rollers such that each of said films completely applied to said first and second sides has a length corresponding to that of said base plate.

2. The film applying method according to claim 1, wherein said prescribed distance is 2 cm from said base plate.

3. A film applying method comprising the steps of:

conveying a base plate having first and second sides to a film applying position;

attaching leading edges of films onto first and second film feed members opposed to said first and second sides of said base plate, said first and second film feed members being secured to first and second mounting members slidably supported by a body frame of a film applying apparatus;

moving said first and second film feed members toward leading edges of the first and second sides of said base plate, such that the leading edges of said films are tentatively applied to the leading edges of said first and second sides of said base plate, respectively;

completely applying said films to said sides of said base plate such that each of said films completely applied to said first and second sides has a length corresponding to that of said base plate;

wherein said moving step further comprises driving said first and second mounting members with only a motor through rack-and-pinion mechanisms from respective original positions toward said base plate such that said first and second feed members are positioned in predetermined positions at a prescribed distance from said base plate, said predetermined positions being close to said base plate as compared to the original positions;

simultaneously driving said first and second mounting members via only drive cylinders from said predetermined positions toward said base plate such that said films are tentatively applied to said first and second sides of said base plate, respectively; and driving said first and second mounting members away from said base plate utilizing only said drive cylinders after said films are tentatively applied to said base plate.

4. The film applying method according to claim 3, wherein said prescribed distance is 2 cm from said base plate.

* * * * *